United States Patent [19]

Hiraki

[11] Patent Number: 5,160,534
[45] Date of Patent: Nov. 3, 1992

[54] TITANIUM-TUNGSTEN TARGET MATERIAL FOR SPUTTERING AND MANUFACTURING METHOD THEREFOR

[75] Inventor: Akitoshi Hiraki, Yasugi, Japan
[73] Assignee: Hitachi Metals Ltd., Tokyo, Japan
[21] Appl. No.: 708,340
[22] Filed: May 31, 1991

[30] Foreign Application Priority Data

Jun. 15, 1990 [JP] Japan ................................. 2-157287
Nov. 27, 1990 [JP] Japan ................................. 2-324910
Feb. 12, 1991 [JP] Japan ................................. 3-40999
Mar. 20, 1991 [JP] Japan ................................. 3-81634

[51] Int. Cl.$^5$ .............................................. G22F 9/00
[52] U.S. Cl. ........................................ 75/248; 419/23; 419/29; 419/32; 419/33; 419/38; 419/49; 419/53; 419/54; 148/513
[58] Field of Search .................... 75/248; 419/23, 29, 419/32, 33, 38, 49, 53, 54; 148/11.5 P, 126.1

[56] References Cited

U.S. PATENT DOCUMENTS 4,331,476  5/1982  Helderman et al. ................. 75/214
4,838,935  6/1989  Dunlop et al. ...................... 75/230

FOREIGN PATENT DOCUMENTS 63-303017 12/1988 Japan .

*Primary Examiner*—Stephen J. Lechert, Jr.
*Attorney, Agent, or Firm*—Sughrue, Mion, Zinn, Macpeak & Seas

[57] ABSTRACT

Ti-W target material for sputtering includes a structure composed of a W phase, a Ti phase, and a Ti-W alloy phase of which 20% or more consist of the area ratio of a micro structure covering the cross section of the Ti-W target material. The Wi-W target material further includes dispersed tungsten particles, the Ti-W alloy phases substantially surrounding the W grains, and the Ti phases dispersed adjacent to the Ti-W alloy phase or the W grains. The formation of the Ti-W alloy phases is capable of reducing a substantial amount of the Ti phase in the target material. It is thus possible to prevent the generation of particles attributable to a difference between sputtering speeds of Ti and Ti-W.

11 Claims, 6 Drawing Sheets

( X 600 )

(×600)

(×600)

50μm
(×600)

50μm
(×600)

TITANIUM-TUNGSTEN TARGET MATERIAL FOR SPUTTERING AND MANUFACTURING METHOD THEREFOR

BACKGROUND OF THE INVENTION

1. FIELD OF THE INVENTION

The present invention relates to a titanium-tungsten (Ti-W) target material used for forming or otherwise making a barrier metal layer used in a semiconductor device, and to a manufacturing method therefor.

2. DESCRIPTION OF THE RELATED ART

As the degree of integration of LSIs has increased in recent years, the migration of aluminum (Al) has become a problem which is caused by a mutual diffusion in a contact portion between aluminum wiring and a semiconductor substrate of silicon. As a countermeasure for such a problem, the insertion of a barrier metal layer into the space between the aluminum wiring and the silicon substrate has been under investigation.

A thin titanium-tungsten film (typically composed of 10 wt% of titanium and the balance of tungsten) is often used as a barrier metal layer. A method of sputtering a target is employed as a method of forming such a thin titanium-tungsten film.

In general, a titanium-tungsten target material for the thin film is manufactured by blending and hot-pressing of tungsten powder and titanium powder.

Since the oxygen content of the titanium powder serving as a raw material of the conventional titanium-tungsten target is high, only targets having a high oxygen content are obtained.

In such a target material having a high oxygen content, oxygen is liberated while sputtering is performed, thus causing undesirable problems, such as cracks of the target, oxidation of formed films, and variations in the film quality.

U.S. Pat. No. 4,838,935 discloses a method of reducing the oxygen content of such a titanium-tungsten target. In this document, a titanium-tungsten target material with its carbon and oxygen contents reduced can be obtained at high density and a low void content. The titanium-tungsten target material can be obtained by replacing at least a portion of titanium powder with hydrogenated titanium, by employing a hydrogenated titanium powder and a tungsten powder having a distribution of a binodal grain diameter, or by employing the hydrogenated titanium powder and a mixture of a titanium powder.

JP-A-63-303017 also discloses a method of reducing the oxygen content of a titanium-tungsten target. In this method, a tungsten powder and a hydrogenated titanium powder are blended together and hot-pressed after or while both powders are dehydrogenated.

The use itself of the hydrogenated titanium powder is effective in preventing oxidation and also in reducing a pickup of oxygen when the hydrogenated titanium powder is pulverized because it can be pulverized more readily than an ordinal titanium powder.

It has thus become possible to obtain titanium-tungsten targets having oxygen concentration as low as 900 ppm or less.

As has been described, research has been extensively conducted to reduce the oxygen content of titanium-tungsten target materials.

The above publications, however, do not disclose how the structures of titanium and tungsten constituting a target affect sputtering. That is, the publications do not disclose at all that an micro structure, particularly the presence of a titanium phase, is related to the occurrence of a particle phenomenon during sputtering which will be described below.

With recent higher density and thinner lines of electrode patterns of semiconductor products, even when the previously described titanium-tungsten target having low oxygen concentration is used for sputtering, large particles what is called "particles" are generated on a thin plated film as a result of the sputtering. This has given rise to a new problem of breaking electrode wiring.

A reduction in the oxygen content of the titanium-tungsten target alone does not eliminate the generation of the particles.

To solve such a problem, the inventor of the present invention has examined in detail the relationship between a target structure and the generation of particles, and found that large titanium grains are related to the generation of the particles. In other words, the inventor has ascertained that, when both titanium and tungsten are present, titanium having a light atomic weight is selectively sputtered, and tungsten grains, which are close to or contained inside the large titanium grains are scattered from the target material in the form of large diameter particles. This is one of the reasons for the generation of the particles on the substrate.

SUMMARY OF THE INVENTION

The object of the present invention is therefore to provide a titanium-tungsten target material for a sputtering process, having an adjusted or controlled structure, in which particles of the thin plated or deposited film are rarely generated, and to provide a manufacturing method for such a target material.

The inventor has found that it is effective to form titanium-tungsten alloy phase in a target material from which tungsten particles, due to a difference between sputtering speeds of titanium and tungsten, are not deposited on the film.

The present invention provides a titanium-tungsten target material for a sputtering process comprising a structure composed of a tungsten phase, a titanium phase and a titanium-tungsten alloy phase, in micro structure, which occupies 20% or more area ratio of a surface of a cross section of the titanium-tungsten target material. The titanium-tungsten target material is composed of dispersed tungsten grains, the titanium-tungsten alloy phases (or grains) substantially surrounding the tungsten grains (or phases) and the titanium phases (or grains) dispersed adjacent to the titanium-tungsten alloy phases and/or the tungsten grains.

The formation of the titanium-tungsten alloy phase can substantially reduce the amount of the titanium phase, and thereby preventing generation of coarse titanium grains in the target material of this invention. A difference between sputtering speeds of the tungsten phase and the titanium phase can be reduced by forming the titanium-tungsten alloy phase.

The area ratio of the titanium-tungsten alloy phase is 20% or more which are required value for substantially reducing the deposition of particles in the thin plated film. The titanium-tungsten alloy phase can be hardly formed if it contains the titanium-tungsten alloy phases to such a degree that the alloy is formed in portions where the tungsten powder and the titanium powder are pressed to be bonded with one another.

In this invention, the area ratio of the titanium-tungsten alloy phase is limited to 20% or more in order to indicate the amount of the titanium-tungsten alloy phase which can reduce the generation of the particles.

Any alloy of titanium and tungsten may be used as a titanium-tungsten alloy phase regardless of their compositions. A titanium-tungsten alloy phase containing fine α-titanium which is precipitated during cooling is not excluded in this invention.

In the present invention, the tungsten and titanium phases are not necessarily composed of only tungsten and titanium, respectively. For example, when a sintered body of tungsten and titanium powders is heated, it is natural for a small amount of titanium to diffuse in the tungsten phase of an obtained structure. Likewise, a small amount of tungsten may diffuse in the titanium phase.

The average diameter of crystal grains in the titanium-tungsten target material is preferably 10 μm or less in the invention, and it is determined in the following manner. A photograph is taken which shows the structure of a fractured surface of the target material. A plurality of parallel straight lines are drawn on the photograph at 20 mm intervals. The number and diameter of crystal grains intersected by the lines are measured. The total of the diameters of the respective crystal grains is divided by the number of the crystal grains. The quotient is defined as the average crystal grain diameter. As the average crystal grain diameter in the titanium-tungsten target material increases, so does the effect of the crystal orientation of the respective crystal grains in a sputtering process. The sputtering speed for each crystal grain changes, thus making the target surface uneven. Particles in the plated film increase because sputtered particles are attached to or separated from uneven portions on the surface.

It is preferable in the target that the crystal grain size be as small as possible. There is no problem when the crystal grain size is not more than 10 μm.

It is also preferable that the titanium phase be as little as possible, since the titanium phase may be attributable to the deposition of the particles on the substrate. When the titanium phase covering the cross section of the target material has an area ratio of 10% or less, the frequency at which the particles are generated is greatly reduced. An area ratio of 10% or less is therefore desirable.

It is also preferable in the present invention that the area ratio of the titanium-tungsten alloy phase, which covers the cross section of the target material, be 60% or more.

To decrease the deposition of the particles, it is preferable to further increase the amount of titanium-tungsten alloy. A target material, by which the particles are less deposited on the substrate, can be obtained by increasing the area ratio of the titanium-tungsten alloy phase to desirably 60% or more, and more desirably to 80% or more.

The respective distributions of the grains and alloy phases are the most important in the target material of this invention. It is further preferable for oxygen content to be 600 ppm or less in order to obtain a homogeneous thin film. In the invention, a target material having small oxygen content can be obtained. For example, a hydrogenated high-purity titanium powder is used, which is produced by pulverizing and blending at the same time in a non-oxidizing atmosphere.

The present invention also relates to a manufacturing method for a titanium-tungsten target material wherein tungsten powder and titanium powder are sintered under pressure to obtain a sintered body. The obtained sintered body is heat-treated so as to form a titanium-tungsten alloy phase.

More specifically, the invention pertains to a manufacturing method for a titanium-tungsten target material wherein a tungsten powder and a hydrogenated titanium powder are blended and pulverized, and then sintered under pressure to obtain a sintered body after or while both powders are dehydrogenated. The obtained sintered body is heat-treated to form a titanium-tungsten alloy phase so that it substantially surrounds each of tungsten grains.

The purity of the tungsten powder is desirably 99.99% or more, and more desirably 99.999% or more, whereas the purity of high-purity titanium is desirably 99.99% or more.

The hydrogenated titanium powder is used in the invention because it is capable of reducing the oxygen content in the target material.

The titanium and tungsten powders can be mixed and next pulverized. In the invention, however, it is possible to prevent the formation of a heterogeneous mixture caused by a difference between the specific gravities of titanium and tungsten. This can be achieved by employing a device, such as a ball mill or an attritor, in which the powders are mechanically pulverized and mixed.

The titanium and tungsten powders are pulverized preferably to an average grain diameter of 5 μm or less. Such a reduction of grain size allows titanium and tungsten to disperse evenly, thereby preventing titanium grains from becoming large when the powder are sintered, and accelerating the alloying of titanium and tungsten in a heat treatment.

In this invention, the heat treatment temperature range is preferably from 1300° C. to 1500° C. This is because the titanium-tungsten alloy phase is formed through a diffusion treatment while the growth of crystal grains is being inhibited.

Titanium and tungsten can be mixed together at any compounding ratio so that they form a complete solid solution. The heat treatment temperature is preferably 1500° C. or less. If the heat treatment temperature is less than 1300° C., on the other hand, it is not preferable in terms of practical use, because titanium and tungsten are little alloyed even after the heat treatment is performed for 50 hours.

A hot isostatic press (hereinafter referred to HIP) or a hot press may be utilized for sintering under pressure.

It is possible to scatter particles each having a maximum diameter of 0.5 μm or more to such a degree that about 0.1 or less of each such particle is present in each one square centimeter. These particles are on the surface of a thin film plated by sputtering the titanium-tungsten target of this invention. Thus, semiconductor devices with extremely few defects can be obtained.

DESCRIPTION OF THE PREFERRED EMBODIMENTS

Experiment 1

Figure 1:
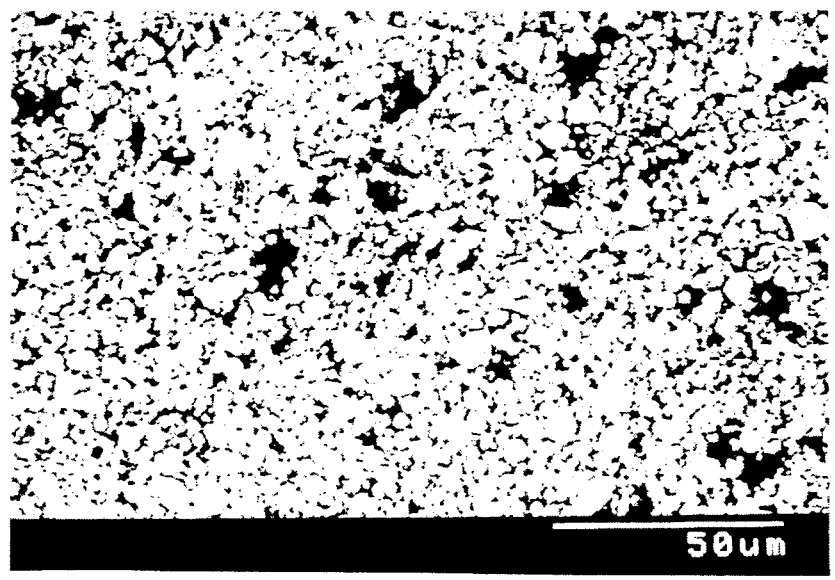
FIG. 1 is a photograph showing a micro structure of a sintered alloy material.

A high-purity tungsten powder (99.999% or more purity, and 5 $\mu$m or less average particle diameter) and hydrogenated high-purity titanium (99.99% or more purity, and 75 $\mu$m or less average particle diameter, hereinafter called hydrogenated titanium) were blended together in such a ratio that 10.36 wt% of hydrogenated titanium remain. The mixture was introduced into a ball mill for exclusive use a pot with a tungsten liner and tungsten balls. The air within the pot was then degassed and substituted by argon gas so as to render a non-oxidizing atmosphere. Under the above conditions, the mixture was blended together while they are pulverized for 90 minutes.

Twenty micron or more hydrogenated titanium was not observed in the obtained blended powder. The average grain size of the blended powder was 4 $\mu$m, the oxygen content of the same being 540 ppm.

A HIP can having an inner diameter of 400 mm was filled with the blended powder. While the can was degassed to $5 \times 10^{-5}$ torr, the blended powder was heated at 700° C. for 24 hours and was dehydrogenated. After the dehydrogenation treatment was conducted, the HIP can was sealed. A HIP treatment was carried out at 1000 atm, 1250° C. for two hours. FIG. 1 shows a photograph of a micro structure of the thus obtained sintered material which is magnified 600 times. In FIG. 1, white grains are the grains showing tungsten phases, whereas gray portions which are present among the tungsten grains are titanium phases. It is found that although tungsten in the sintered material is dispersed in the form of fine particles, titanium is partially agglegated. At this stage, it was not possible to detect titanium-tungsten alloy phases.

By changing the amount of heat treatment time and by degassing the can to $10^{-5}$ torr, the sintered material was alloyed at 1380° C. to obtain a target material.

The oxygen content of the obtained target material was substantially 550 ppm.

Figure 2:
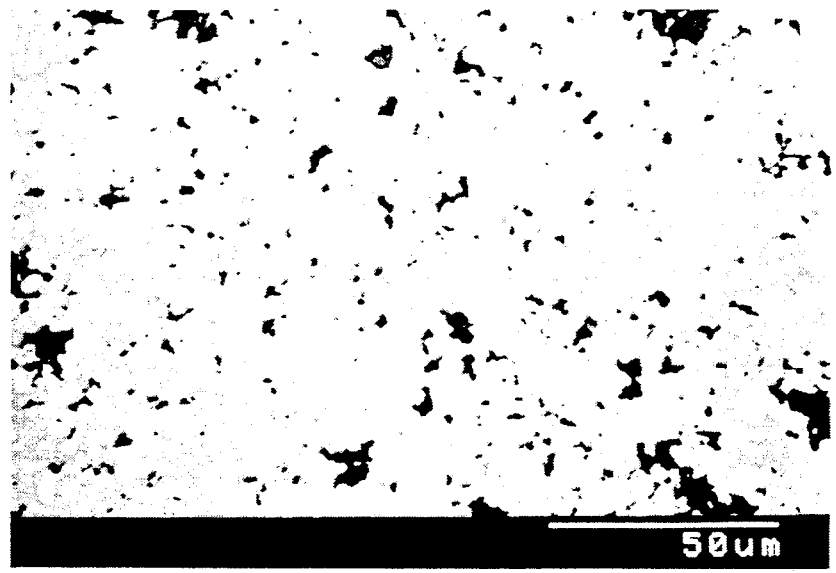
FIG. 2 is a photograph showing a micro structure of a target material of alloy according to the invention which is obtained through a five hours heat treatment.
Figure 3:
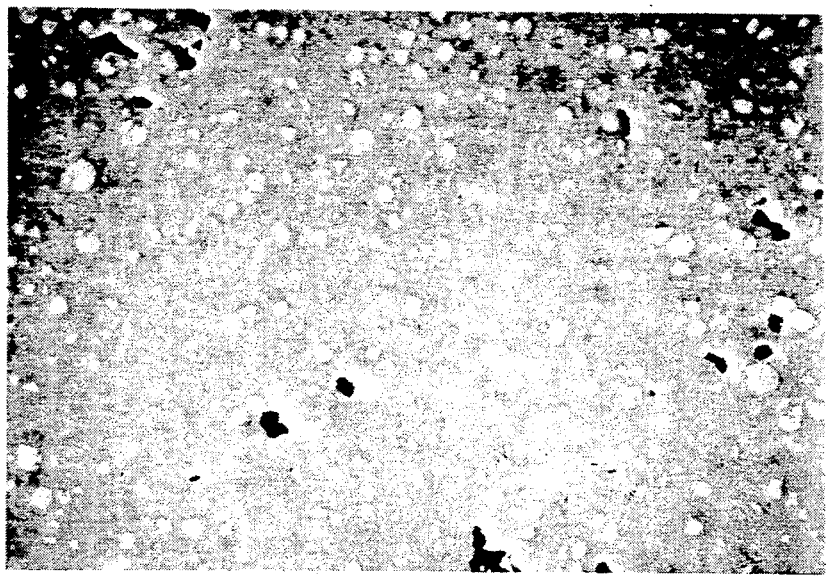
FIG. 3 is a photograph showing a micro structure of the target material of alloy according to the invention which is obtained through a 24-hours heat treatment.

FIG. 2 shows a photograph of a micro structure of one of the target materials thus obtained after five hours of the heat treatment, whereas FIG. 3 is a photograph showing a micro structure of one of the target materials after 24 hours of the heat treatment.

In FIGS. 2 and 3, white portions are the grains showing tungsten phases, while gray portions surrounded substantially by the tungsten grains are titanium-tungsten alloy phases. Black portions are titanium phases which are dispersed adjacent to the titanium-tungsten alloy phase or the tungsten phases.

As shown in FIG. 3, the tungsten grains are present in the form of fine grains as a result of the 24-hour heat treatment, and are almost covered with the titanium-tungsten alloy phases. The tungsten grains surrounded by the titanium phase were not detected. It was found that the titanium phase constituted an extremely small percentage of the target material.

Figure 4:
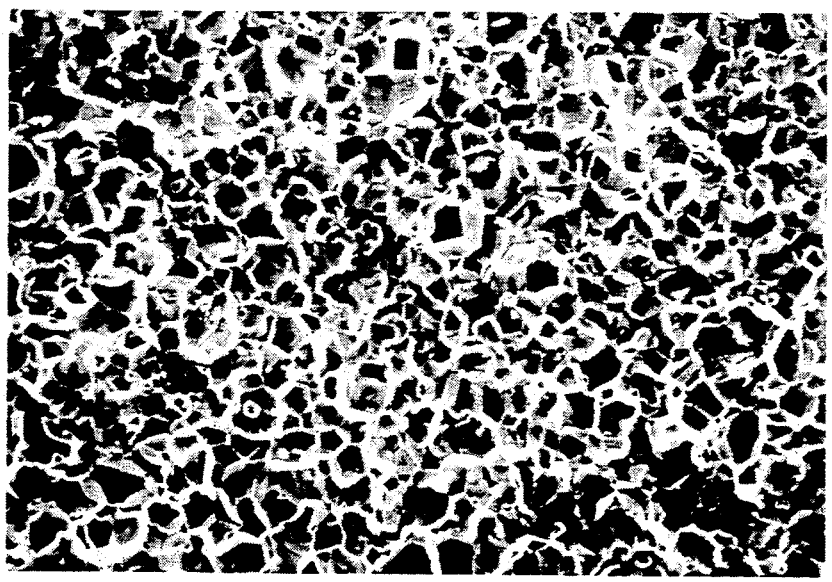
FIG. 4 is a photograph of a micro structure showing the size of crystal grains on a fractured surface of the target material of the invention, the target material being obtained through a 50-hours heat treatment.

FIG. 4 is a photograph showing a micro structure of the target material after it has been heat-treated for 50 hours. The photograph was magnified 600 times and obtained by observing a fractured surface of the target material with a scanning electron microscope. As can be seen from FIG. 4, the target material which has been heat-treated for 50 hours is composed of crystal grains, each having an average diameter of 10 $\mu$m or less.

Figure 5:
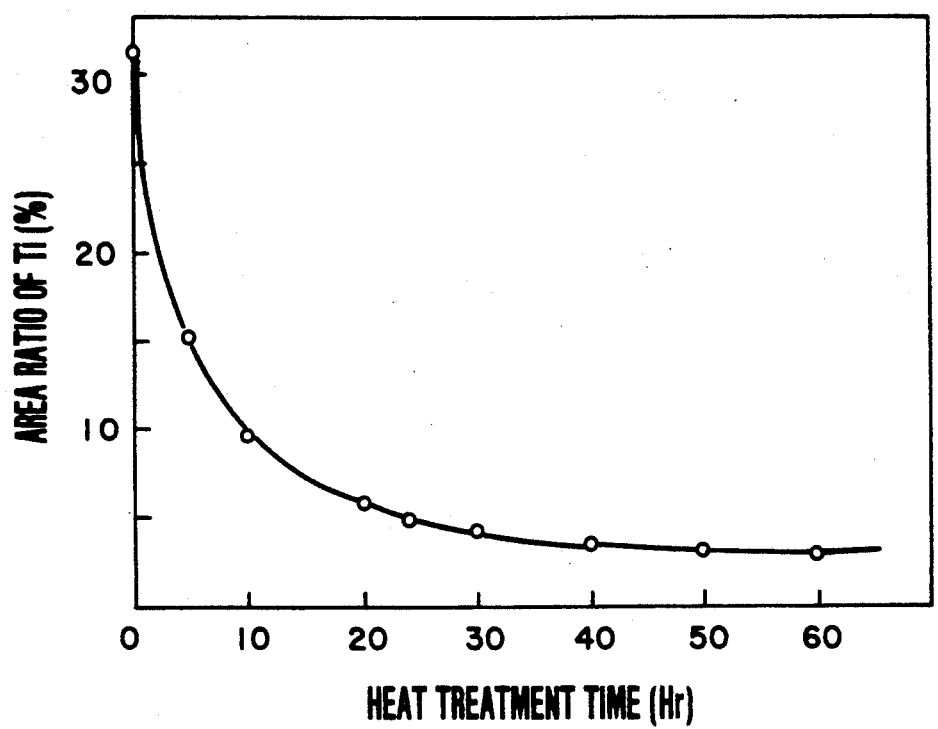
FIG. 5 is a graph showing a relationship between the heat treatment time (hr.) and area ratio of titanium.
Figure 6:
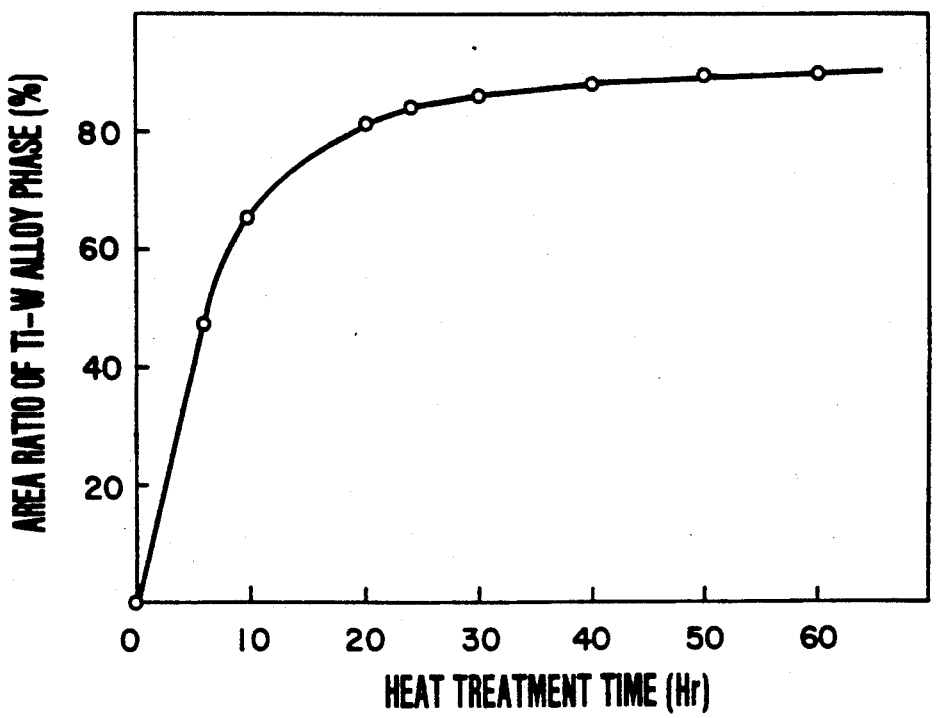
FIG. 6 is a graph showing a relationship between the heat treatment time (hr.) and area ratio of a titanium-tungsten alloy phase.

FIG. 5 shows the area ratio of the titanium phase covering the cross section of the target material obtained by changing the heat treatment time length. Similarly, FIG. 6 shows the area ratio of the titanium-tungsten alloy phase covering the cross section of the target material obtained also by changing the heat treatment time length.

It is understood that as the length of the heat treatment time increases, the titanium phases decrease. When the heat treatment is performed for 20 hours or more, the area ratio of the titanium phase falls to 10% or more, whereas that of the titanium-tungsten alloy phase increases to 80% or more.

As shown in FIG. 4, a photograph was taken which showed a micro structure of a fractured surface of the target material obtained at various heat treatment times. A plurality of parallel straight lines were drawn on this photograph at 20 mm intervals. The number and diameter of crystal grains intersected by the straight lines were measured to calculate the average diameter of the crystal grains.

Figure 7:
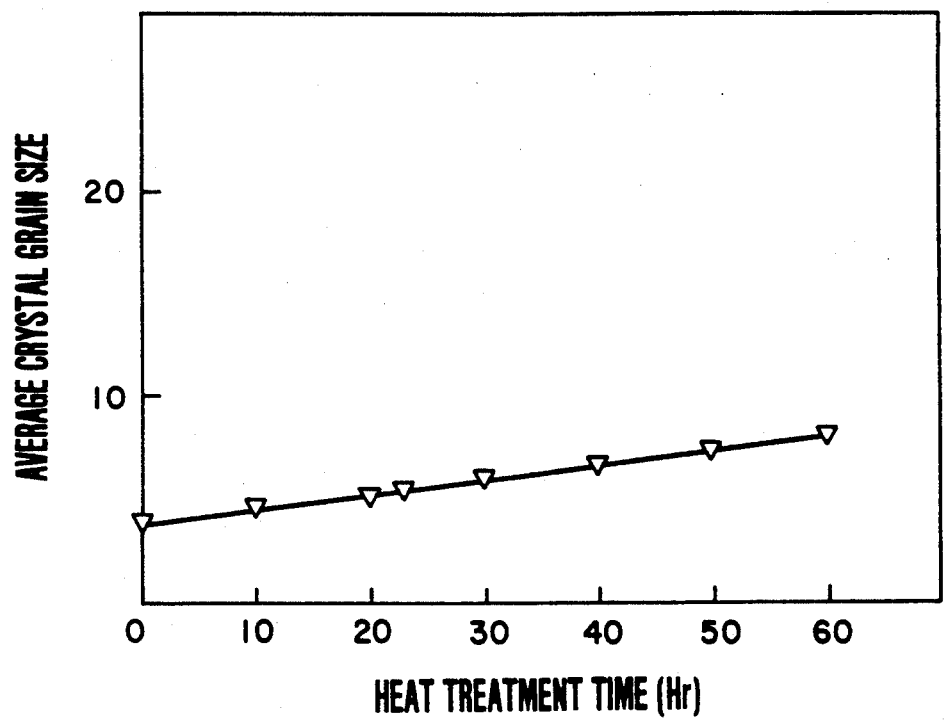
FIG. 7 is a graph showing the relationship between the length of heat treatment time and the average diameter of a crystal grain.

FIG. 7 shows the average diameter of the crystal grains at this stage. It is apparent from FIG. 7 that as the heat treatment time increases, the crystal grains grow. It is also apparent that the crystal grains grow slowly at the heat treatment of 1380° C., and that such a heat treatment temperature is preferable.

Figure 8:
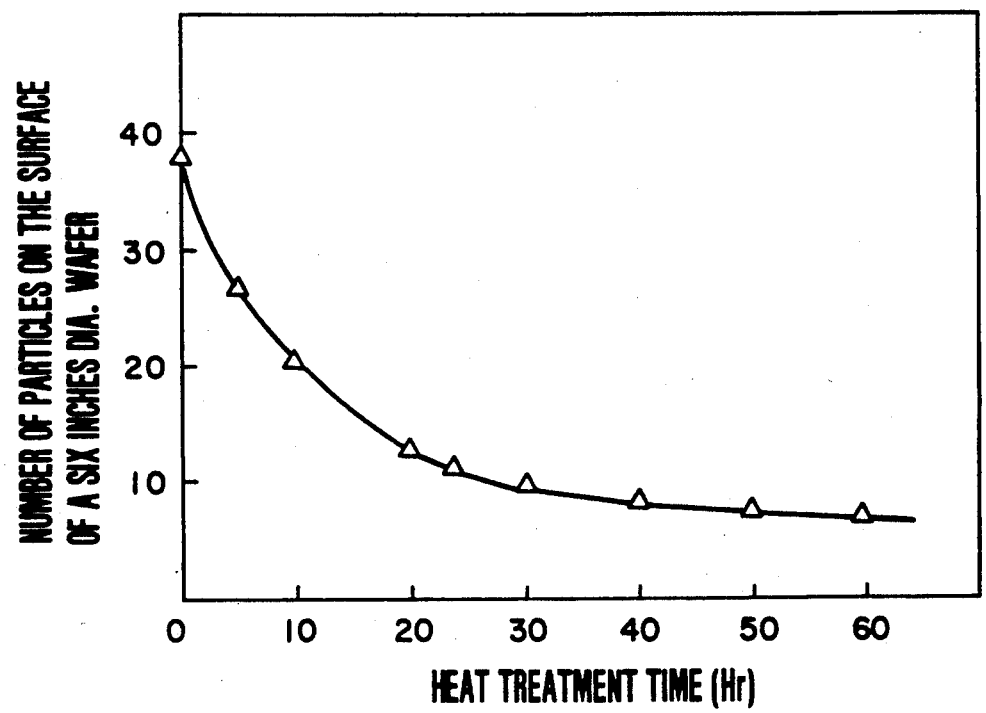
FIG. 8 is a graph showing the relationship between the heat treatment time and the number of particles deposited on the surface of a six inches diameter wafer.

The obtained target material was machined to a target material having a diameter of 300 mm. This machined target material was used to perform a sputtering process with respect to a 6-inch wafer. FIG. 8 shows the number of particles on the wafer having a diameter of 0.5 $\mu$m or more which are deposited when the target materials obtained at various heat treatment times were used for sputtering.

By comparing FIGS. 5 and 6 with FIG. 8, it is found that the titanium phases decrease by alloying the target material, whereas the titanium-tungsten alloy phases increase, while at the same time, the number of the particles decreases markedly. It is also found that the alloying of titanium-tungsten can suppress the generation of the particles on the wafer. The area ratio of the titanium phase is found to be preferably 10% or less.

EXPERIMENT 2

A sintered material obtained in the same manner as in the first experiment was heat-treated for 24 hours by changing the heat treatment time length. The area ratio of titanium phase and that of titanium-tungsten alloy were measured.

Figure 9:
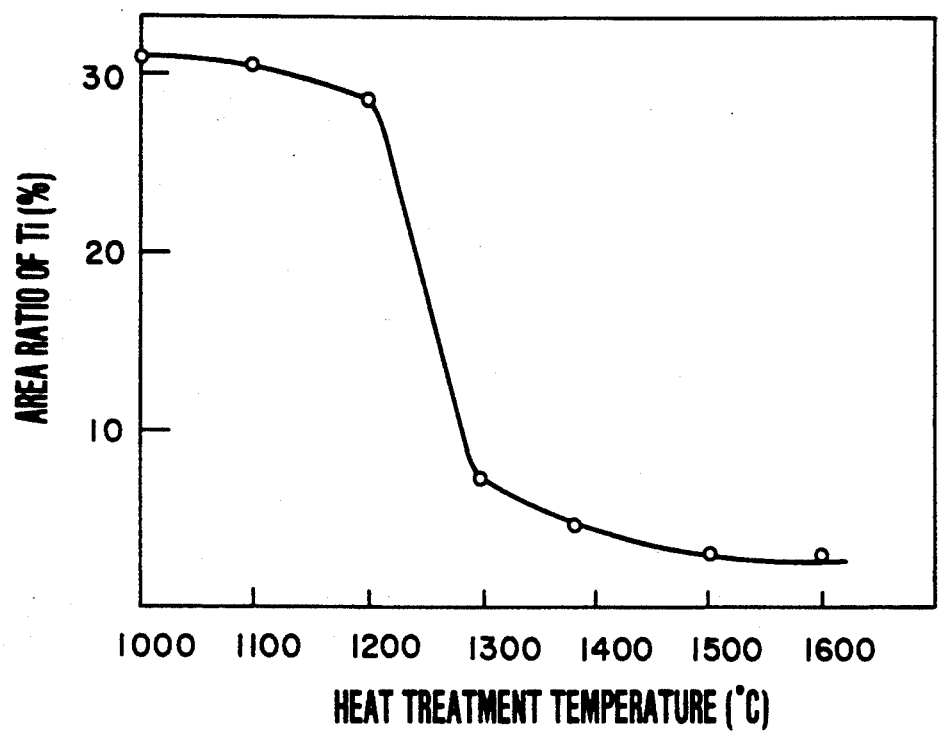
FIG. 9 is a graph showing the relationship between heat treatment temperatures and the area ratio of titanium.
Figure 10:
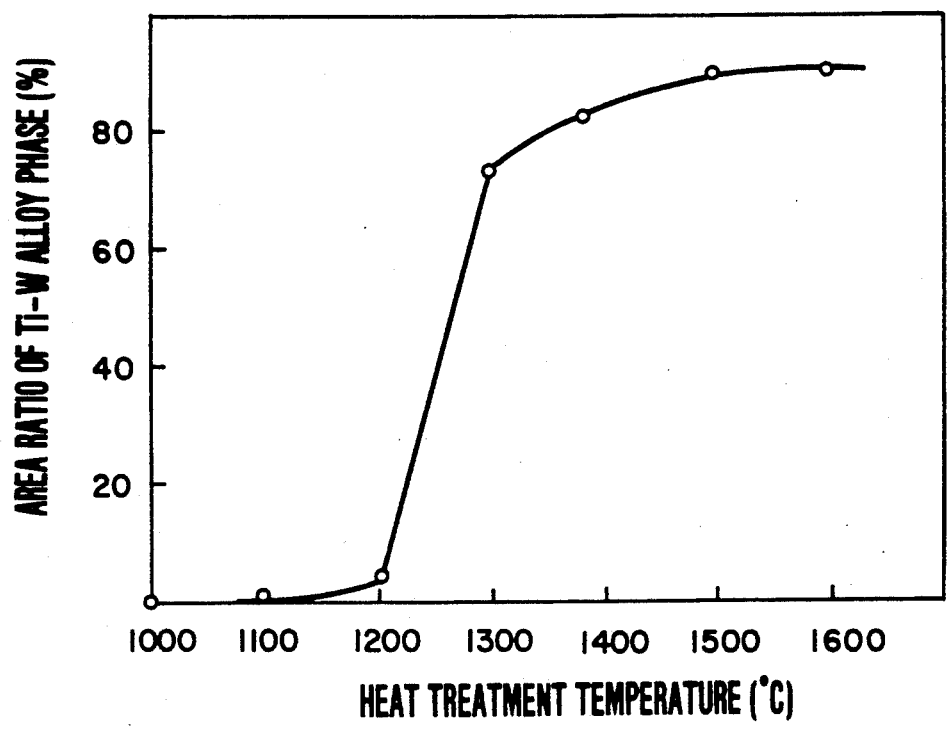
FIG. 10 is a graph showing the relationship between heat treatment temperatures and the area ratio of a titanium-tungsten alloy phase.

FIG. 9 shows the measurements of the area ratio of the titanium phase, whereas FIG. 10 shows those of the area ratio of the titanium-tungsten alloy.

FIG. 9 provides that the titanium area ratio decreases remarkably at heat treatment temperatures of 1300° C. or more, while FIG. 10 proves that the area ratio of the titanium-tungsten alloy increases considerably at the same temperatures.

Figure 11:
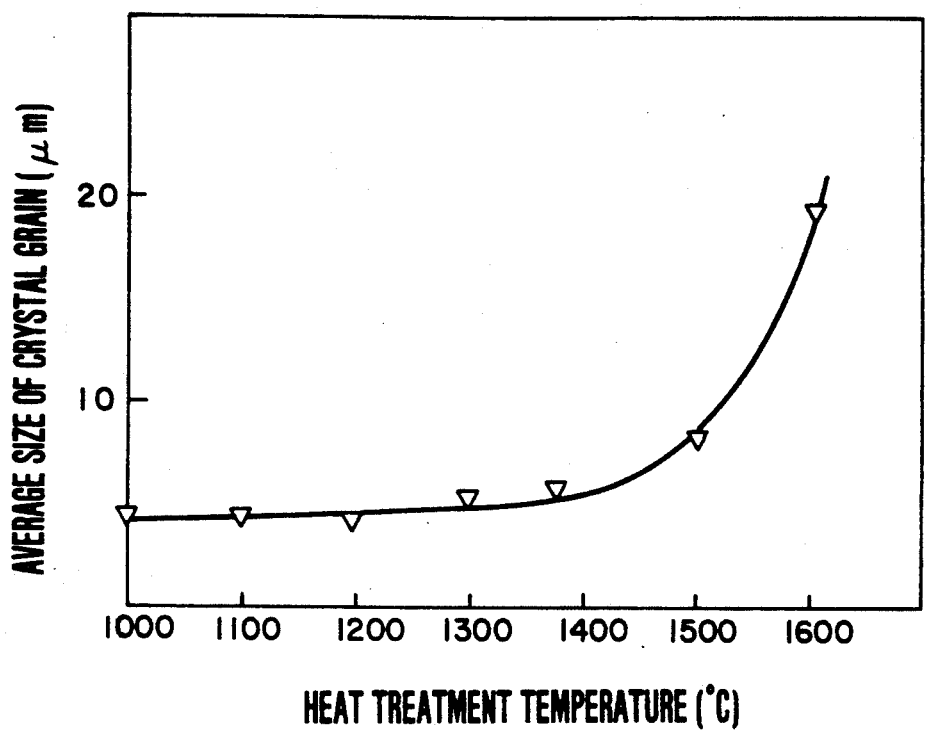
FIG. 11 is a graph showing the relationship between heat treatment temperatures and the average diameter of a crystal grain.

FIG. 11 shows the diameters of the crystal grains obtained in the same way as in the first experiment. It can be seen from FIG. 11 that the crystal grains grow remarkably at temperatures of more than 1500° C., and that it is therefore desirable to perform a heat treatment at temperatures of 1500° C. or less.

Figure 12:
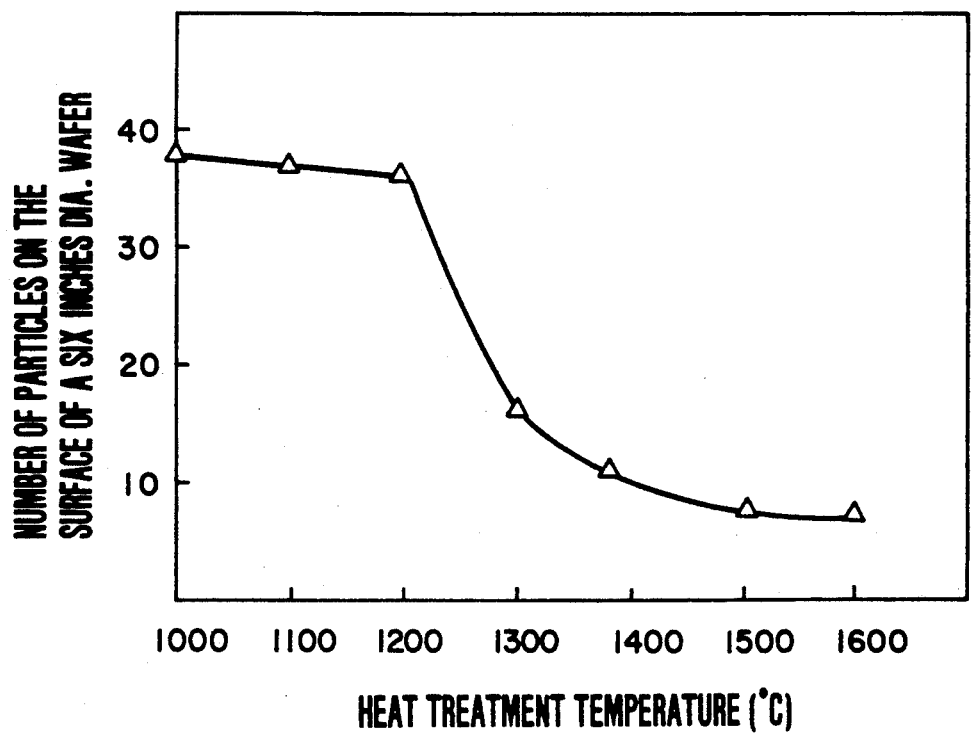
FIG. 12 is a graph showing the relationship between heat treatment temperatures and the number of particles deposited on the surface of a six inches diameter wafer.

The number of deposited particles was investigated. These particles were generated when an obtained target material was used for sputtering in the same manner as in the first experiment. FIG. 12 shows the results of the investigation.

It is obvious from FIG. 12 that the number of the particles generated can be reduced by performing the heat treatment at temperatures of 1300° C. or more.

The above proves that it is particularly preferable to perform the heat treatment at temperatures ranging from 1300° to 1500° C. for approximately 24 hours, which may be a practical heat treatment for forming titanium-tungsten alloy phases.

The method according to the present invention makes it possible to manufacture titanium-tungsten target materials having a novel structure in which tungsten grains and titanium phases are dispersed, while titanium-tungsten alloy phases mainly constitute the structure. The features of the structure are that very few large titanium grains are contained in the structure, and that the diameters of the crystal grains are small. By using the target materials in accordance with this invention, it is possible to perform sputtering in which a very small number of particles are generated. It is therefore possible to provide targets and thin plated films which are very effective in improving the quality of semiconductor devices. In addition to the above feature that a small number of the particles are generated, since the oxygen content is small, the invention has advantages in that it is possible to suppress cracks of the target, oxidation of formed films, and variations in the quality of the films which have been sputtered.

what is claimed is:

1. A titanium-tungsten target material for a sputtering process with a structure consisting essentially of a tungsten phase, a titanium phase and a titanium-tungsten alloy phase, the titanium-tungsten alloy phase occupying an area ratio of 20% or more of a cross section of the structure of the titanium-tungsten target material.

2. A titanium-tungsten target material for a sputtering process according to claim 1, with a structure consisting essentially of dispersed tungsten grains, titanium-tungsten alloy phases substantially surrounding the tungsten grains and titanium phases dispersed adjacent to at least one of the titanium-tungsten alloy phases and the tungsten grains.

3. A titanium-tungsten target material for sputtering according to claims 1 or 2, wherein the average diameter of crystal grains of said structure is not more than 10 μm.

4. A titanium-tungsten target material for sputtering according to claims 1, 2 or 3, wherein the area ratio of the titanium phase covering the cross section of the target material is not more than 10%.

5. A titanium-tungsten target material for sputtering according to claims 1, 2 or 3, wherein the area ratio of the titanium-tungsten phase covering the cross section of the target material is not less than 60%.

6. A titanium-tungsten target material for sputtering according to claims 1, 2, 3, 4 or 5, wherein oxygen content is not more than 600 ppm.

7. A manufacturing method for a titanium-tungsten target material for sputtering comprising the steps of:
    sintering under pressure tungsten powder and titanium powder so as to form a sintered body; and
    heat treating the obtained sintered body so as to form titanium-tungsten alloy phases.

8. A manufacturing method for a titanium-tungsten target material for sputtering comprising the steps of:
    blending and pulverizing tungsten powder and hydrogenated titanium powder;
    sintering under pressure the tungsten powder and the hydrogenated titanium powder after or while they are dehydrogenated so as to form a sintered body; and
    heat-treating the obtained sintered body so as to form titanium-tungsten alloy phases.

9. A manufacturing method for a titanium-tungsten target material for sputtering according to claims 7 or 8, wherein the heat-treatment is performed at a temperature ranging from 1300° to 1500° C.

10. A manufacturing method for a titanium-tungsten target material for sputtering according to claim 8, wherein the blending and pulverizing are effected mechanically at the same time.

11. A manufacturing method for a titanium-tungsten target material for sputtering according to claims 7, 8, 9 or 10, wherein a hot isostatic press is used for sintering under pressure.

* * * * *